United States Patent
Fernandez et al.

(10) Patent No.: US 6,678,823 B1
(45) Date of Patent: Jan. 13, 2004

(54) METHODS AND APPARATUS FOR AUTHENTICATING DATA STORED IN SEMICONDUCTOR MEMORY CELLS

(75) Inventors: Alberto J. Fernandez, Miami, FL (US); Carlos D. Bormey, Miami, FL (US); Ismael E. Negrin, Miami, FL (US)

(73) Assignee: XTec, Incorporated, Miami, FL (US)

( * ) Notice: Subject to any disclaimer, the term of this patent is extended or adjusted under 35 U.S.C. 154(b) by 0 days.

(21) Appl. No.: 09/562,365

(22) Filed: May 1, 2000

(51) Int. Cl.[7] .............................................. G06F 17/00
(52) U.S. Cl. ........................ 713/193; 713/189; 713/190
(58) Field of Search ................................ 713/193, 190, 713/189, 188, 191–192, 1–2, 100, 182, 187, 400–503, 300–340

(56) References Cited

U.S. PATENT DOCUMENTS

| | | | |
|---|---|---|---|
| 6,532,506 B1 | * | 3/2003 | Dunstan et al. ............. 713/324 |
| 6,557,066 B1 | * | 4/2003 | Crafts et al. ................. 713/503 |
| 6,621,425 B2 | * | 9/2003 | Maeda ........................ 713/182 |

OTHER PUBLICATIONS

Eitan et al., NROM: A novel localized trapping, 2–bit nonvolatile memory cell, Electron Device Letters, IEEE vol. 21, Issue 11, Nov. 2000, pp. 543–545.*

Zhao et al., Trapping and trap generation studies on the gate oxide of MOSFETs, Sub–Micron VLSI Reliability, IEE Colloquium on, Jan. 8, 1992, pp. 3/1 to 3/5.*

Fukuda et al., Electron Device Letters, IEEE, vol. 24, Issue 7, Jul. 2003, pp. 490–492.*

* cited by examiner

Primary Examiner—David Jung
(74) Attorney, Agent, or Firm—Priest & Goldstein, PLLC

(57) ABSTRACT

A method and apparatus for authenticating data stored in semiconductor memory cells. A reference fingerprint representing trapped charges in memory cells of a semiconductor device is created. Data is written to selected cells of the semiconductor device. After the data is written, the levels of trapped charges in the selected cells is determined by performing a series of read operations using progressively greater read thresholds. The level of trapped charges in a memory cell is identified by noting the voltage threshold at which the memory cell is read as a digital "1". Once the levels of trapped charges of the memory cells are identified, a reference fingerprint is created to identify the semiconductor device. The reference fingerprint may be stored on the semiconductor device or on an external device. When it is desired to authenticate the semiconductor device, an authentication fingerprint is created by determining levels of trapped charges in selected cells of the semiconductor device, similar to the way in which the stored reference fingerprint was created. The stored reference fingerprint is retrieved and compared to the authentication fingerprint. If the authentication fingerprint matches the stored reference fingerprint, the semiconductor device is authenticated. For additional security, an offset voltage may be added to data which is written to the selected cells of the semiconductor device, or the reference fingerprint may be encrypted before storage. Fuzzy logic techniques may be used to compensate for environmental and hardware related fluctuations in the levels of trapped charges of the memory cells.

15 Claims, 7 Drawing Sheets

METHODS AND APPARATUS FOR AUTHENTICATING DATA STORED IN SEMICONDUCTOR MEMORY CELLS

CROSS-REFERENCE TO RELATED APPLICATION

Fernandez U.S. Pat. No. 5,644,636 issued Jul. 1, 1997 addresses related subject matter and is incorporated by reference herein in its entirety.

FIELD OF THE INVENTION

The present invention relates generally to improved techniques for data authentication. More particularly, the invention relates to the use of physical properties of the media used to record the information in generating a reference fingerprint for authenticating the data.

BACKGROUND OF THE INVENTION

Storage of financial and other information in solid-state devices such as semiconductor memory cards is growing more and more prevalent. Large quantities of data representing customer or merchant information, transaction histories, or stored value may be placed on a card and given to the customer. The information may be completely self-contained on the card, allowing the information to be read directly from the card. This approach is different from the use of magnetic cards, which typically contain only an account number or other identifying information, which is used as an index to retrieve the customer information from a database. A semiconductor memory card typically stores data in solid-state memory such as an EPROM or EEPROM. The card is placed in a card writer which provides information to the card in a numerical format and transfers the information through ports provided on the card. The card includes a microcomputer, which receives the information from the reader, processes the information, and stores the information in the memory. Similarly, whenever it is desired to use the information stored on the card, the microcomputer retrieves the information from memory, processes the information, and transfers the information through the ports to an external device such as a card reader. Because high-capacity memory devices are widely available, it is possible to store large quantities of data on such a card, making it versatile and convenient.

After information is written to the semiconductor memory card, it can be given to a customer so that the customer can present the card for reading and writing of data as needed. For example, a cash card may be loaded with information representing cash credits. The card is given to the customer and presented to a merchant or bank whenever a debit is to be made. Upon presentation of the card, the merchant or bank places the card in a reader/writer, reads the balance on the card, makes an appropriate subtraction, and writes the new balance to the card. The debit can be made without a need to retrieve any information other than the information on the card itself.

If a semiconductor memory card is to be given to a customer, security is vital. A customer in possession of a semiconductor memory card has long-term, unsupervised access to the card, and has the opportunity to attack the card at leisure in order to attempt to store unauthorized information on the card. It is possible for a skilled attacker to retrieve numerical information from a semiconductor memory card through probing of the internal components of the device, or through other unauthorized means. If card security is provided only through numerical means, such as numerical authenticators, or cryptoprocessing keys, it is possible to create a counterfeit card which contains information duplicated from a legitimate card.

Mediametric techniques offer considerable advantages in providing reliable data authentication. These mediametric techniques provide security through the use of data related to physical characteristics of the storage media. Solid state media possess characteristics which are impossible to duplicate precisely, but which can be precisely measured. These include, for example, variations in the remnant charge of EEPROM's, or variations in row/column addressing circuits. These and other characteristics have been used for authentication. A numerical representation, or fingerprint, of authenticating characteristics is created and stored. When the card is presented, the authenticating characteristics are measured, and a fingerprint is created and compared against the original fingerprint. Such techniques are described in detail in Fernandez U.S. Pat. No. 5,644,636, which is assigned to the assignee of the present invention and incorporated in its entirety herein by reference.

One advantage of such mediametric techniques is that some solid-state devices possess characteristics which will be altered by any tampering with the device. An EPROM or EEPROM, for example, includes memory cells in which data is represented by levels of trapped charges. The level of charge in a memory cell is established when data is written to the cell, but it is impossible to set a desired level of charge in a cell. However, once the data is written to the cell, the level of charge within the cell remains stable until data is again written to the cell. Moreover, the level of charge trapped within the cell can be measured precisely if appropriate access is given to the cell. It is therefore possible to determine the levels of charges within a cell after data has been written to the cell, and then store a representation of the level of charges for comparison with the actual level of charges present, in order to determine whether the data cell is authentic.

In the Fernandez patent cited above, the advantages of mediametric techniques are claimed and broadly addressed. In a preferred embodiment of that patent, those techniques have been implemented utilizing an analog port built into the memory to retrieve charge levels, and an analog to digital converter to convert the analog charge data to digital form for creation of a numerical fingerprint. Improved techniques for creating and evaluating a reference fingerprint based on charge levels in memory cells, wherein the levels of charges can be established without analog measurements or additional analog circuitry will be highly advantageous.

SUMMARY OF THE INVENTION

Levels of trapped charges in a memory cell may be determined by identifying a voltage of the cell. Identifying the voltage of a memory cell is accomplished by establishing a threshold required to represent a "1" and reading the voltage at the cell. If the voltage meets the threshold, the data in the cell is read as a "1". If the voltage does not meet the threshold, the cell voltage is read as a "0". This fact is employed in order to determine charge levels within memory cells without a need to use an analog port to allow measurements of charge levels within the cells. Instead, the voltage appearing at the data output of the memory array is read using differing thresholds in order to determine the voltage. In order to create a reference fingerprint for a memory array, data is written to selected cells within the array. After the data is written, it is read again. However, repeated read operations are performed, with the threshold used to establish a "1" being set low and then increased a small amount at each successive read. In this way, over a succession of read operations with changing thresholds, the charge level in each cell which is read can be established. For example, if a voltage representing data can range between 0 and 5.0 volts and the threshold is set at first to 0.1 volts, and then raised by 0.1 volts per iteration over 50 iterations of read operations, the voltage level of a cell can be established within 0.1 volts. Alternatively, depending on whether the cell contains a "1" or a "0", the threshold can be set to the maximum possible value for a "0" and then adjusted downward through repeated iterations, or set to the minimum possible value for a "1" and then adjusted upward through repeated iterations. If it is not known initially whether the cell contains a "1" or a "0", a conventional read operation can be performed in order to identify the data stored in the cell. This makes it possible to identify the voltage in the cell in fewer read operations than if the initial threshold were simply set at 0.0 volts and adjusted upward until it reached 5.9 volts.

Once the voltage level of the selected cells are established in this way, a reference fingerprint for the selected cells can be established and stored. Later, when the memory array is to be authenticated, the voltage levels of the selected cells are established using a similar succession of read operations. The voltage levels, once determined are then compared against the previously stored reference fingerprint.

A more complete understanding of the present invention, as well as further features and advantages of the invention, Will be apparent from the following Detailed Description and the accompanying drawings.

DETAILED DESCRIPTION

Figure 1:
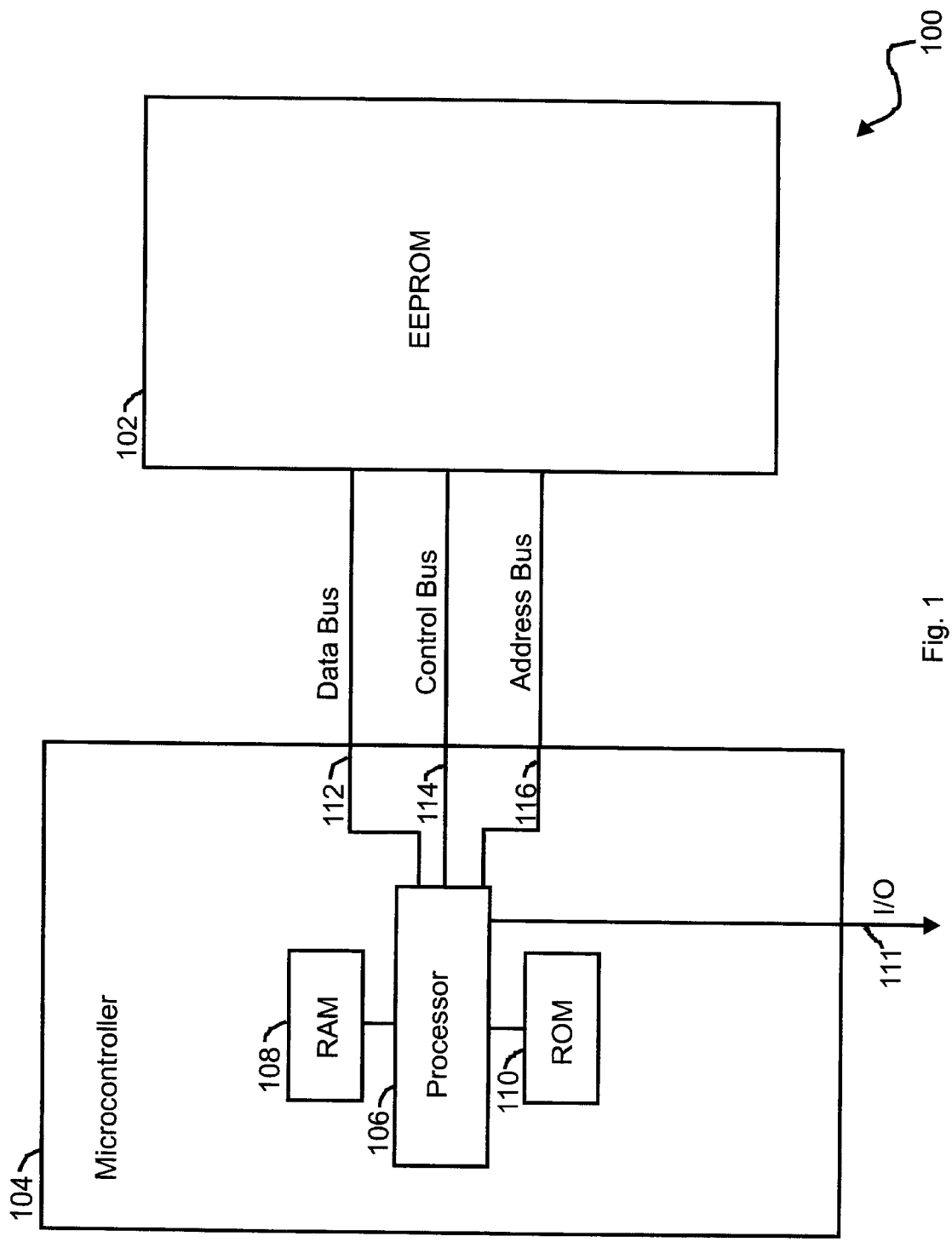
FIG. 1 illustrates a data storage device adapted to authentication according to the present invention.

FIG. 1 illustrates a data storage device 100 which may be authenticated using the principles taught by the present invention. The device 100 includes an EEPROM 102 communicating with a microcontroller 104. The microcontroller 104 includes a processor 106 and memory, such as a ROM 108 and a RAM 110. The ROM 108 includes instructions and other data for controlling the operation of the processor 106, while the RAM 110 is used by the processor 106 to store values and data during the operation of the processor 106. The microcontroller 104 also includes an input/output (I/O) port 111, used to transfer data in and out of the data storage device through communication with the processor 106.

The processor 106 communicates with the EEPROM through a data bus 112, control bus 114 and address bus 116. The processor 106 directs operation of the EEPROM by placing instructions on the control bus 116 and reads and writes data to and from addresses in the EEPROM by placing the desired address on the address bus 118 and either placing data on or reading data from the data bus, depending on whether a read or write operation is being performed. Data storage here is shown accomplished through the use of a EEPROM, but any number of suitable alternatives may be used to perform the present invention.

Data such as financial data may be stored in the data storage device 100 by providing appropriate data and instructions to the microcontroller 104 through the I/O port 118. The microcontroller 104 will store the data in the EEPROM 102. A data storage device such as the device 100 may be embodied as a stored value card or other identification card which may present an attractive target for counterfeiting or unauthorized modification. For example, a customer given possession of a stored value card implemented as a data storage device such as the device 100 may wish to add value to the card by storing new data to the EEPROM 102. Alternatively, a counterfeiter may wish to create additional copies of a stored value card by copying data from the EEPROM of a legitimate card to the EEPROM of a card constructed by the counterfeiter. In order to detect unauthorized modifications or counterfeiting of the data storage device 100, it is important to provide a reliable means to distinguish between an authentic device and a copied or modified device.

Writing data to a semiconductor memory device such as the EEPROM 102 of FIG. 1 creates trapped charges in cells of the memory device. It is not possible to choose a level of charges to be stored in a cell of a memory device, but once the data has been written and the charge level has been established, the charge level can then be accurately determined.

Figure 2:
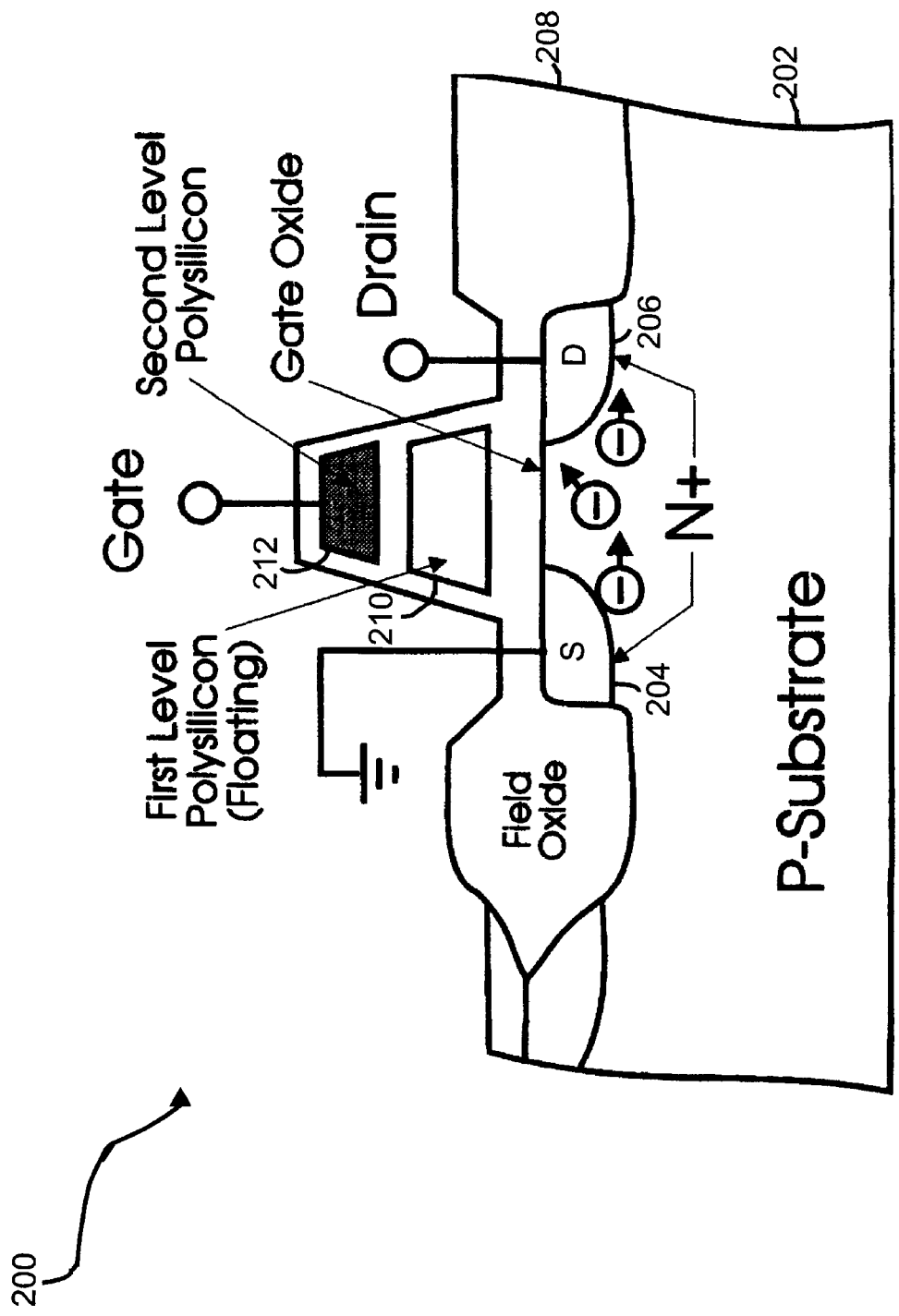
FIG. 2 illustrates a semiconductor memory cell suitable for use according to the teachings of the present invention.

FIG. 2 illustrates a memory cell 200 which may be advantageously employed according to the teachings of the present invention. The memory cell 200 may comprise a transistor integrated on a p-type substrate 202. The transistor comprises a source (S) 204 and a drain (D) 206 which are fabricated using well known techniques by the diffusion of n+impurities on the substrate 202. The transistor includes a field oxide layer 208 that overlays the source 204 and the drain 206, and a floating gate 210 fabricated from a first layer of polysilicon that overlays the oxide layer 208. The transistor further comprises a gate 212 fabricated from a second layer of polysilicon that overlays the floating gate 210. Data may be programmed in the memory cell 200 for purposes of data storage according to the well known technique of floating-gate charge injection. For example, a potential which is typically greater than 12 volts is applied to the drain 206 to create a strong electric field that energizes electrons to jump from the drain 206 region to the floating gate 210 region. The electrons attracted to the floating gate 210 become trapped in the floating gate 210 when the potential is removed from the drain 206. When charges are trapped in the floating gate 210, the threshold of the memory cell 200 changes from a relatively low value, which is associated with the memory cell 200 when no charge or a small charge is present and is called an erased condition, to a higher value, which indicates that programming of the memory cell 200 has occurred. If a low voltage potential for programming a logic level low or "0" in the memory cell 200 is applied to the gate 212, then electrons are not attracted to the floating gate 210, and thus the floating gate 210 remains uncharged. On the other hand, if a high voltage potential for programming a logic level high or "1" is applied to the gate 212, then a large number of electrons will be attracted to the floating gate 210, thereby charging the floating gate 210.

It is well known to one of skill in the art that typical voltages for programming high and low logic levels depend upon the type and design of the semiconductor memory device being used. The level of charges that will be trapped in the memory cell 200 as a result of programming depends upon the characteristics of the semiconductor material and the geometry of the structures in the memory cell 200. For instance, variations in doping levels and dopant purities and the thickness of doped regions of a semiconductor substrate will cause inherent random variations in the level of charges that are trapped in a memory cell when a specific voltage level is applied for a specified amount of time during programming. These inherent random variations make reproduction or duplication of the same relative level of trapped charges in a second memory cell for purposes of obtaining an identical level of trapped charge in the second memory cell very difficult, if not impossible. The level of charges which will be trapped in a memory cell also depends on environmental conditions, such as temperature and the presence of stray static charges, existing at the time that the memory cell is programmed. In addition, the previous level of trapped charges for the memory cell and the total number of write cycles applied to the memory cell, known as the history of the memory cell, contribute to the level of charges trapped in the memory cell. Therefore, with each programming event the pattern of the trapped charges in memory cells of a memory array will vary in a manner which cannot be reproduced, even when the same memory cell is programmed with the identical data. The pattern of trapped charges in memory cells of the array can be used to provide reliable authentication for a memory device employing an array of memory cells such as the cell 200.

Figure 3:
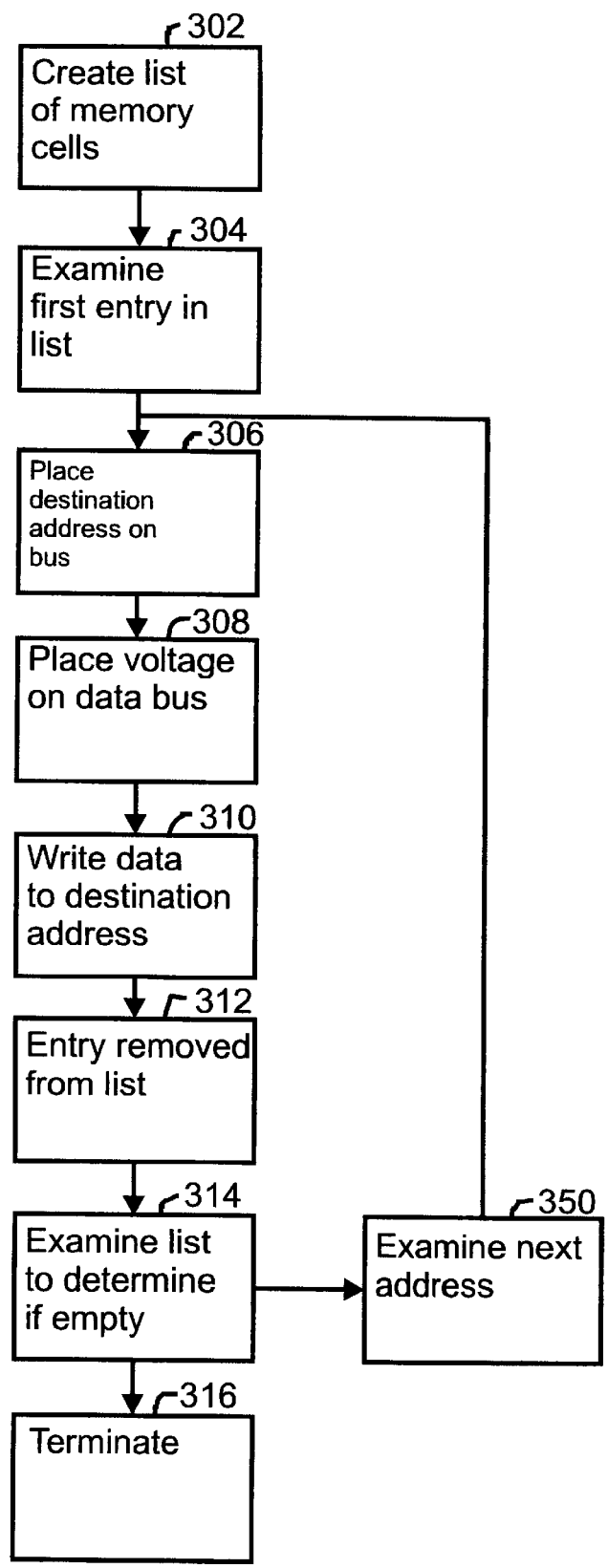
FIG. 3 illustrates a process for writing data to semiconductor memory cells according to the present invention.

FIG. 3 illustrates a process 300 for writing data according to the present invention. The data written can then be used to determine charge levels of memory cells to which the data has been written. The process of determining the charge levels is discussed below in connection with FIG. 4. The process may suitably be employed with a data storage device such as the device 100, employing a processor, EEPROM and data, address and control buses similar to those illustrated in FIG. 1 above. While illustrated in the presently preferred context of a processor communicating with an EEPROM, it will be recognized that the techniques of the present invention may be employed with any memory device employing trapped charges within memory cells.

At step 302, a list of selected memory cells to which data is to be written is created. At step 304, a value of "1" or "0" is associated with each memory cell of the list, as the data to be written to that memory cell. At step 304, the first entry in the list is examined to determine the destination .address where the data is to be written. At step 306, the destination address is placed on the address bus. At step 308, a voltage representing a modified nominal "0" or "1" is placed on the data bus, depending on whether a "I" or a "0" is to be written to the destination address. The nominal value of the "1" or "0" is offset by a small random intentional error, suitably on the order of +/−10% of the nominal voltage signal. The introduction of an intentional offset error to the nominal voltage signal level used for writing data provides additional security for the stored data, because it makes it more difficult for a counterfeiter or other unauthorized user to predict the level of trapped charges in a memory cell, and thus renders it more difficult to recreate that same level in copying or modifying a memory cell. At step 308, the control bus is set to enable a write operation. At step 310, the data is written to the destination address. At step 312, the entry for which the data was written is removed from the list. At step 314, the list is examined to determine if it is empty. If the list is not empty, the process proceeds to step 316 and the next entry on the list is examined to determine the destination address where data is to be written. The process then returns to step 306. If the list is empty, the process terminates at step 350.

Figure 4:
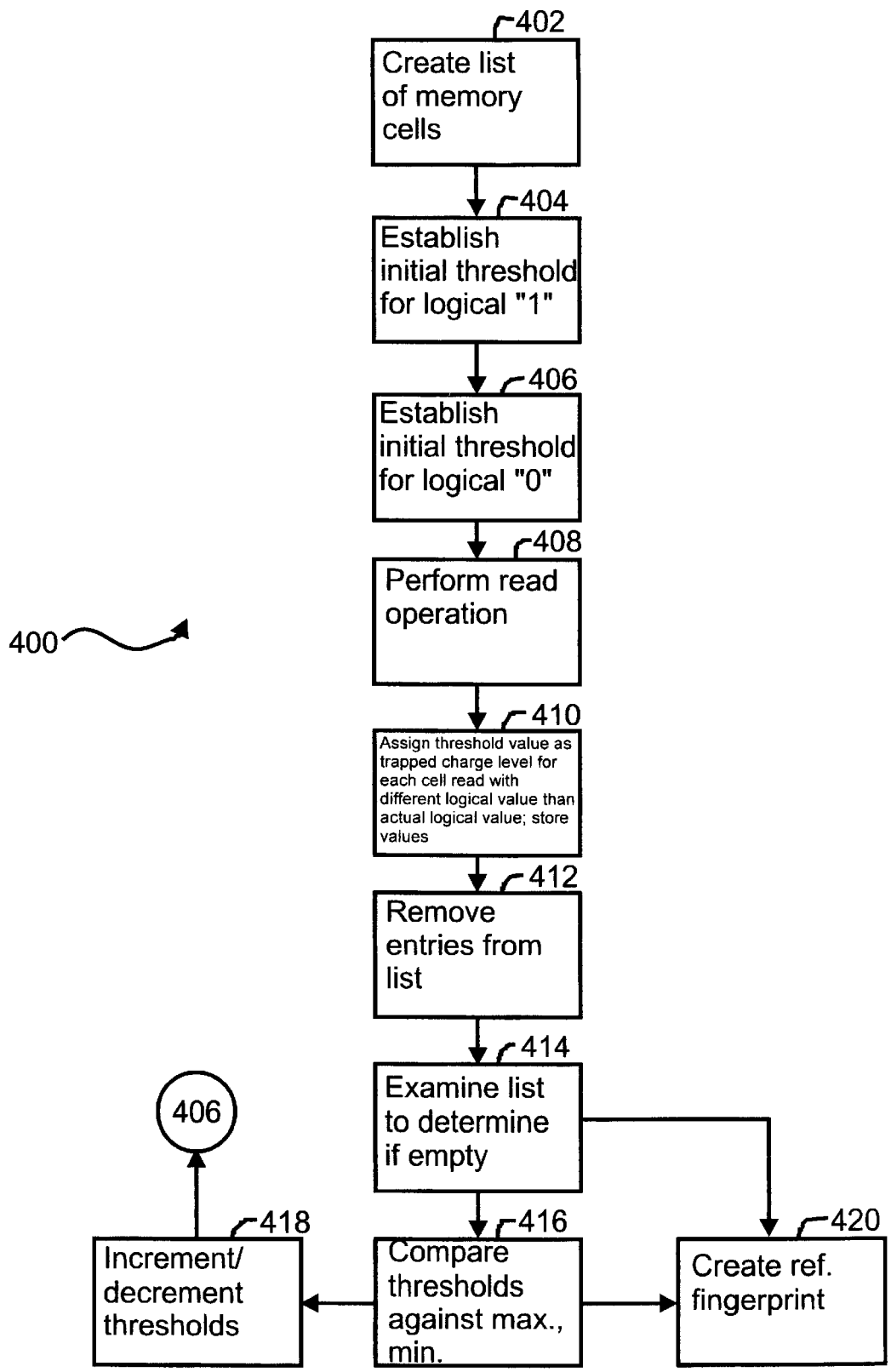
FIG. 4 illustrates a process for reading data from semiconductor memory cells according to the present invention.

FIG. 4 illustrates a process 400 for obtaining and storing data representing levels of trapped charges in selected programmed memory cells of a memory array according to the present invention. At step 402, a list of selected memory cells is established. At step 404, an initial logical "1" threshold level is established for each cell containing a logical "1". This threshold level is chosen to be below the expected level for any cell containing a logical "1". For example, if a logical "1" is expected to have a voltage level of 4.0 volts or above, the initial threshold level may be set to 3.9 volts. At step 406, an initial logical "0" threshold level is established for each cell containing a logical "0". This threshold level is chosen to be above the expected level for any cell containing a logical "0". For example, if a logical "0" is expected to have a voltage level of 1.0 volts or below, the initial threshold level may be set to 1.1 volts. At step 408, a read operation is performed for the selected memory cells. At step 410, each of the selected cells which was read in the read operation of step 408 as having a different logical value than the logical value actually contained is assigned the level of trapped charges indicated by the threshold, and a value representing the assigned level of trapped charges is stored for each cell. A cell which contains a logical "1" but which was read as a logical "0" in the read operation of step 408 or a cell which contains a logical "0" but which was read as a logical "1" in the read operation of step 408 is assigned the level of trapped charges indicated by the threshold and a value At step 412, each of the cells which was written as a "0" and recognized as a "1", and which was written as a "1" and recognized as a "0" is removed from the list of selected memory cells. At step 414, the list of selected cells is examined to determine if it is empty. If the list is not empty, the process proceeds to step 416. If the list is empty, the process proceeds to step 420. At step 416, the logical "0" threshold level is examined to determine if it falls below a predetermined minimum and the logical "1" threshold level is examined to determine if it exceeds a predetermined maximum. If the logical "0" threshold level does not fall below the predetermined minimum, or the logical "1" threshold level does not exceed the predetermined maximum, the process proceeds to step 418 and the logical "0" threshold level and the logical "1" threshold level are decremented as appropriate. .The process returns to step 406. If the logical "1" threshold level exceeds the predetermined maximum and the logical "0" threshold level does not fall below the predetermined minimum, the process returns to step 406. Returning now to step 416, if the logical "1" threshold level exceeds the predetermined maximum and the logical "0" threshold level falls below the predetermined minimum, the process proceeds to step 420. At step 420, the stored representations of the levels of trapped charges for the selected cells are retrieved and assembled to create a reference fingerprint which can be used to identify the memory array.

Figure 5:
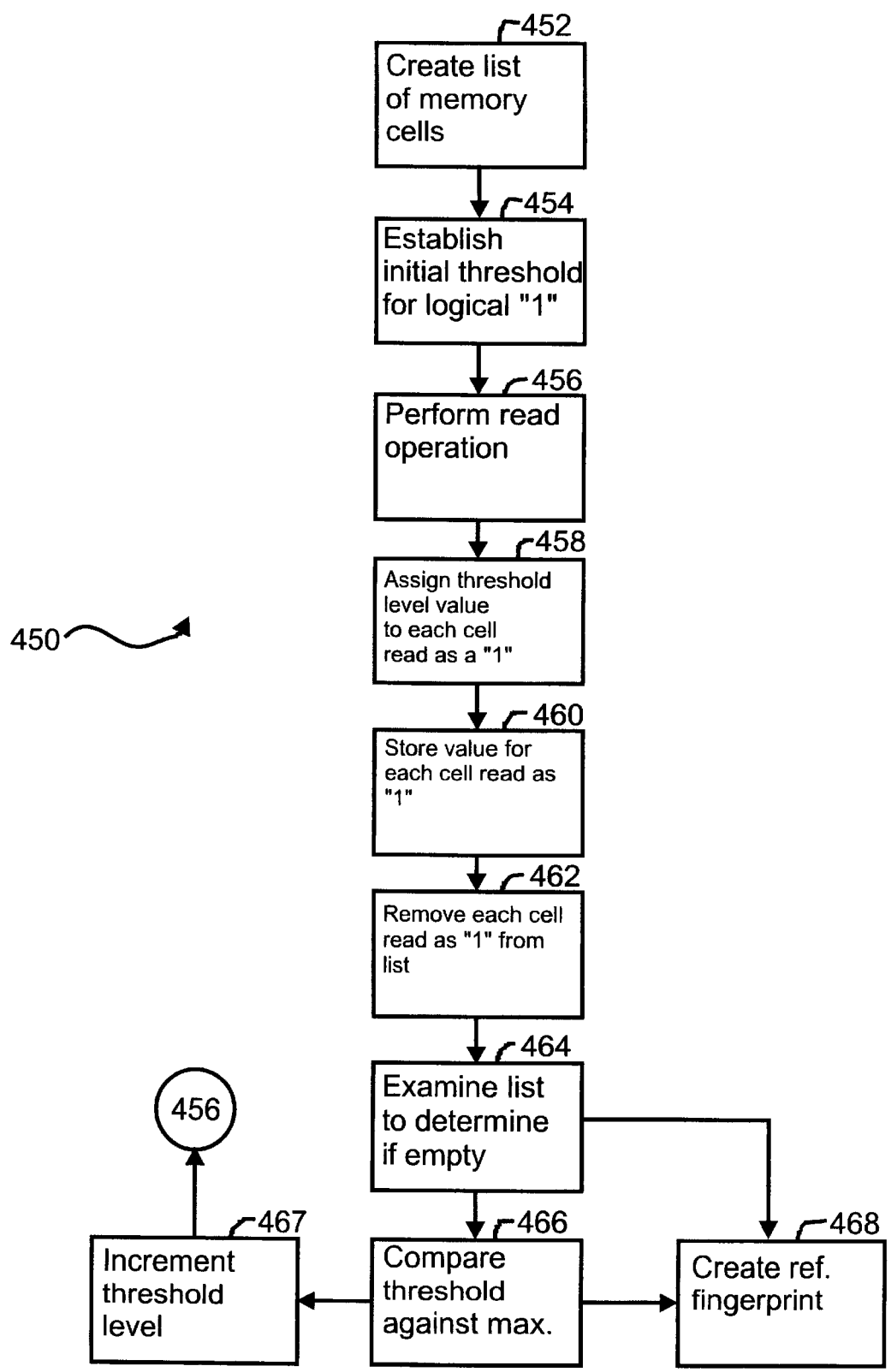
FIG. 5 illustrates an alternative process for reading data from semiconductor memory cells according to the present invention.

FIG. 5 illustrates a process 450 for obtaining and storing data representing levels of trapped charges in selected programmed memory cells of a memory array according to the present invention. At step 452, a list of selected memory cells is established. At step 454, an initial threshold level is established for recognizing a logical "1". At step 456, a read operation is performed for the selected memory cells. At step 458, each of the selected cells which is recognized as a "1" is presumed to have the level of trapped charges indicated by the threshold. At step 460, a value representing the level of trapped charges is stored for each of the cells which was recognized as a "1". At step 462, each of the cells which was recognized as a "1" is removed from the list of selected memory cells. At step 464, the list of selected cells is examined to determine if it is empty. If the list is empty, the process proceeds to step 466. If the list is empty, the process proceeds to step 468. At step 466, the threshold level is examined to determine if it exceeds a predetermined maximum. If the threshold level does not exceed the predetermined maximum, the process proceeds to step 467, the threshold level is incremented and the process returns to step 466. If the threshold level exceeds the predetermined maximum, the process proceeds to step 468. At step 468, the stored representations of the levels of trapped charges for the selected cells are retrieved and assembled to create a reference fingerprint which can be used to identify the memory array.

Figure 6:
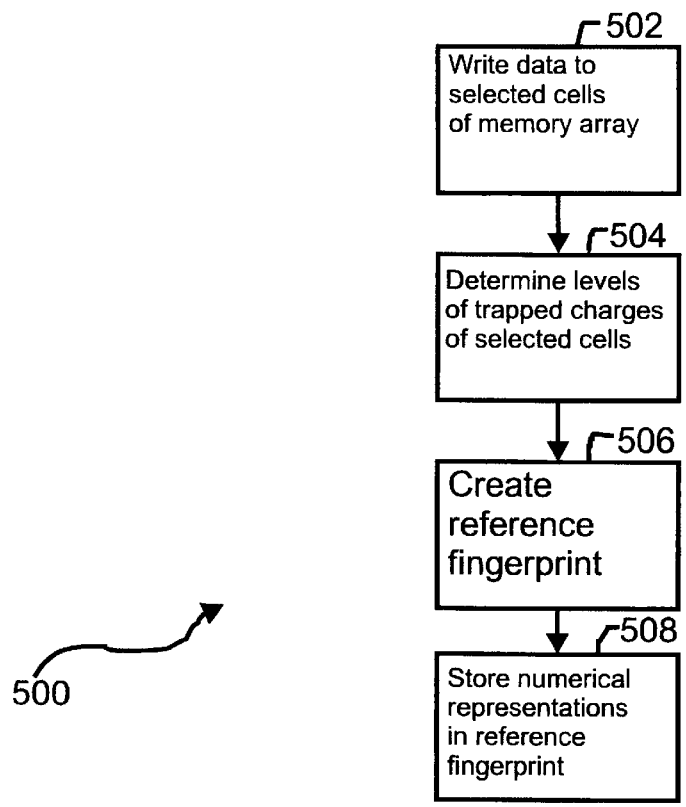
FIG. 6 illustrates a process for generating a reference fingerprint of data stored in semiconductor memory cells according to the present invention.

FIG. 6 illustrates a process 500 for writing data to and reading data from selected cells of a memory array in order to generate a reference fingerprint comprising data representative of levels of trapped charges in the array. The fingerprint is generated immediately after data is written to the array. At step 502, data is written to selected cells of the memory array using the process illustrated in FIG. 3. At step 504, the levels of trapped charges of the selected cells are determined using the process of FIG. 4. At step 506, representations of the levels of trapped charges are used to create a reference fingerprint which uniquely identifies the memory device which was written to, and the characteristics of the writing event. For example, the reference fingerprint for a data string of "0101" may be numerically represented as 4.6 for a "1", 0.5 for a "0", 4.75 for a "1" and 0.45 for a "0" for a particular memory device. These numbers represent the actual voltage levels of the referenced memory cells. Alternatively, the reference fingerprint may comprise a sequenced data string, known as a condensed sequence, which includes selected numerical representations of the measured levels of trapped charges obtained in step 504.

In a further alternative, the numerical representations of the memory cells read in step 504 may be selected for inclusion in the fingerprint by the use of fuzzy logic. For example, fuzzy logic techniques may be used to generate a fuzzy set of data, which by definition is a subset of the set of numerical representations obtained in step 504. The fuzzy set primarily includes significant numerical representations, defined as those representations which are most valuable to the fuzzy set. Conventional mathematical operations associated with processing and analyzing a fuzzy set of data may be used. For instance, the ratios of the levels of trapped charges of adjacent memory cells in a semiconductor device that contains the same programmed data bit may be used as the significant numerical representations which are included in the reference fingerprint. In addition, fuzzy logic can be used, for example, to compensate for temperature variations that may distort the numerical representations obtained in step 504. Such a result would be possible because a fuzzy set could be generated that contains values which, from prior experience, compensate for the effects of temperature on adjacent cells. Other forms of compensation using fuzzy logic could also be used. In a further alternative, a condensed sequence of the numerical representations may be stored as the reference fingerprint using fuzzy logic techniques.

At step 508, the numerical representations included in the reference fingerprint are stored for use in subsequently authenticating the stored data in the memory array. The reference fingerprint may be stored in a chosen location within the memory array, or alternatively may be passed to an output of the memory device for external storage. For further security, the reference fingerprint may be encrypted before storage.

Figure 7:
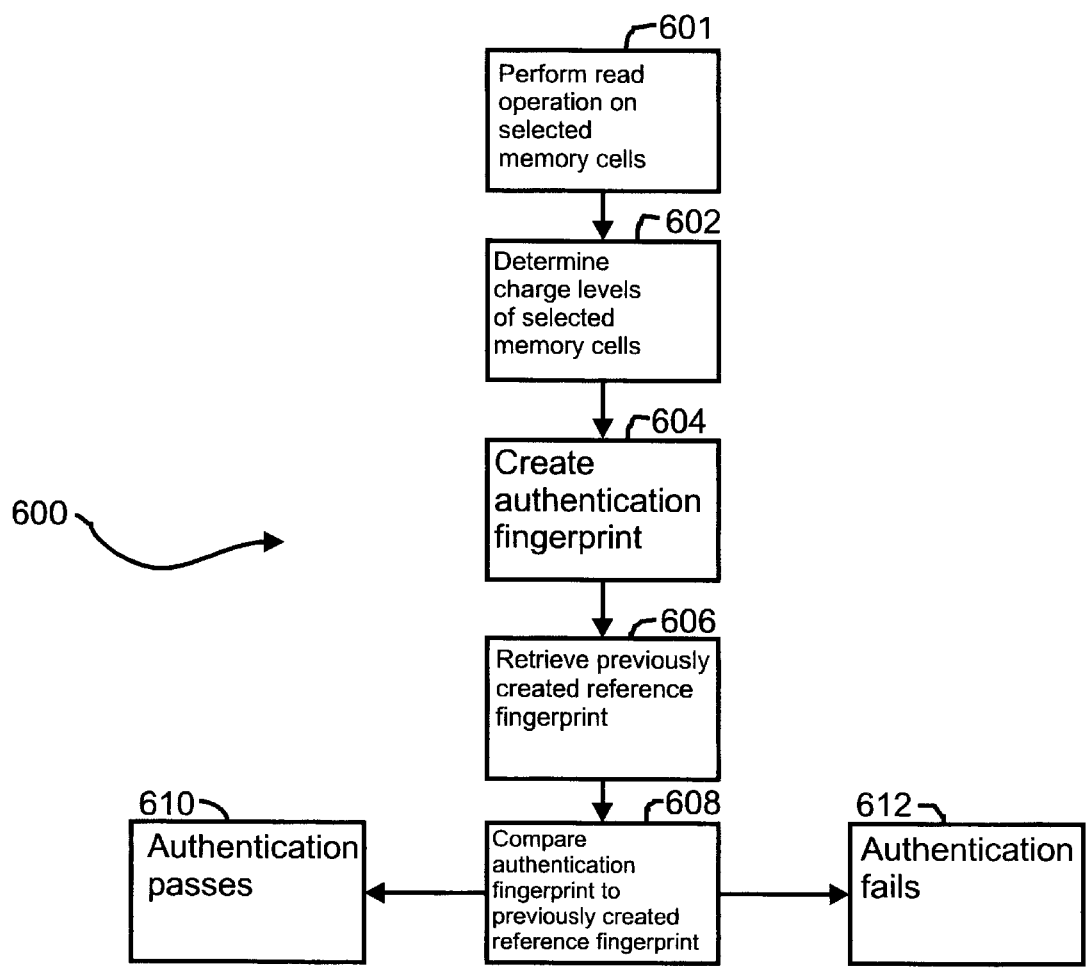
FIG. 7 illustrates a process for authenticating data stored in semiconductor memory cells by employing a reference fingerprint in accordance with the present invention.

FIG. 7 illustrates a process 600 for authenticating a memory device according to the present invention. At step 601, the selected memory cells from which the reference fingerprint was created are read using a normal read process to determine which cells were written as logical "1s" and which cells were written as logical "0s". At step 602, the selected memory cells from which the reference fingerprint was created are read using the process illustrated in FIG. 4 or alternatively the process illustrated in FIG. 5 in order to determine the charge levels of the memory cells. At step 604, an authentication fingerprint is created using the data obtained at step 602. At step 606, the previously created reference fingerprint is retrieved. At step 608, the authentication fingerprint is compared to the reference fingerprint. If the authentication fingerprint matches the reference fingerprint, the process proceeds to step 610 and the memory device passes authentication. If the authentication fingerprint does not match the reference fingerprint, the process proceeds to step 612 and the memory device fails authentication.

While the present invention is disclosed in the context of a presently preferred embodiment, it will be recognized that a wide variety of implementations may be employed by persons of ordinary skill in the art consistent with the above discussion and the claims which follow below.

We claim:

1. A method for securing data in a device containing semiconductor memory cells, comprising the steps of:

writing data to selected ones of the semiconductor memory cells in order to establish a level of trapped charges within each of the selected cells;

identifying each of the selected cells as containing a digital "1" or a "digital "0";

determining a level of trapped charges in each of the selected cells by:

(a) establishing a voltage threshold for distinguishing a digital "1" or a digital 0;

(b) performing a read operation on each of the selected cells;

(c) noting and storing the voltage threshold used for each cell which was read as having a different digital value than was previously identified;

(d) adjusting the voltage threshold for each cell toward a predetermined limit, the limit depending on whether the cell was originally identified as containing a digital "1" or containing a digital "0";

(e) repeating steps (b) through (d) until each cell is read as having a content different from the original content or the voltage threshold for each cell reaches the predetermined limit;

for each of the selected cells, processing the voltage threshold at which the cell was read as having a content different from the original content in order to determine the level of trapped charges in the cell; and converting the levels of trapped charges in the selected cells to numerical form in order to generate a reference fingerprint reflecting the levels of trapped charges in the selected cells.

2. The method of claim 1 and also including the step of writing the reference fingerprint onto the device.

3. The method of claim 1 and also including the step of writing the reference fingerprint to an external device.

4. The method of claim 1 and also including the step of encrypting the reference fingerprint.

5. A method for securing data in a device containing semiconductor memory cells, comprising the steps of:
   writing data to each of selected memory cells by applying a voltage to the selected memory cell in order to establish a level of trapped charges within each of the selected cells;
   determining the level of trapped charges in each of the selected cells by:
   (a) establishing a voltage threshold for identifying a cell as containing a digital "1";
   (b) performing a read operation on each of the selected cells;
   (c) noting and storing the voltage threshold for each cell read as a digital "1";
   (d) incrementing the voltage threshold;
   (e) repeating steps (b) through (d) until each of the selected cells has been read as a digital "1" or the voltage threshold reaches a predetermined maximum;
   processing the voltage threshold required for each of the selected cells to be read as a "1" in order to determine the level of trapped charges in the cell; and
   converting the levels of trapped charges in the selected cells to numerical form in order to generate a reference fingerprint reflecting the levels of trapped charges in the selected cells.

6. The method of claim 5 and also including the step of writing the reference fingerprint onto the device.

7. The method of claim 5 and also including the step of writing the reference fingerprint to an external device.

8. The method of claim 5 and also including the step of encrypting the reference fingerprint.

9. A method of authenticating a device containing semiconductor memory cells, comprising the steps of:
   reading a stored reference fingerprint characteristic of the device;
   determining the level of trapped charges in each of selected memory cells of the device by:
   (a) establishing a voltage threshold for identifying a cell as containing a digital "1";
   (b) performing a read operation on each of the selected cells;
   (c) noting and storing the voltage threshold for each cell read as a digital "1";
   (d) incrementing the voltage threshold;
   (e) repeating steps (a) through (d) until each of the selected cells has been read as a digital "1" or the voltage threshold reaches a predetermined maximum;
   processing the voltage threshold required for each of the selected cells to be read as a "1" in order to determine the level of trapped charges in the cell;
   converting the levels of trapped charges in the selected cells to numerical form in order to generate an authentication fingerprint reflecting the levels of trapped charges in the selected cells; and
   comparing the authentication fingerprint against the stored reference fingerprint.

10. The method of claim 9, wherein fuzzy logic techniques are used to generate the reference fingerprint and the authentication fingerprint to compensate for variations in the reading of data employed to determine levels of trapped charges within the selected memory cells which are caused by environmental and hardware related factors.

11. The method of claim 9 wherein the stored reference fingerprint is read from the device.

12. The method of claim 9 wherein the stored reference fingerprint is read from an external device.

13. The method of claim 9 wherein the step of generating the reference fingerprint further comprises introducing intentional random offsets to each voltage employed to write data to a memory cell.

14. A method of authenticating a device containing semiconductor memory cells, comprising the steps of:
   reading a stored reference fingerprint characteristic of the device;
   determining the level of trapped charges in each of selected memory cells of the device by:
   determining a level of trapped charges in each of the selected cells by:
   (a) establishing a voltage threshold for distinguishing a digital "1" or a digital 0;
   (b) performing a read operation on each of the selected cells;
   (c) noting and storing the voltage threshold used for each cell which was read as having a different digital value than was previously identified;
   (d) adjusting the voltage threshold for each cell toward a predetermined limit, the limit depending on whether the cell was originally identified as containing a digital "1" or containing a digital "0";
   (e) repeating steps (b) through (d) until each cell is read as having a content different from the original content or the voltage threshold for each cell reaches the predetermined limit;
   for each of the selected cells, processing the voltage threshold at which the cell was read as having a content different from the original content in order to determine the level of trapped charges in the cell; and
   converting the levels of trapped charges in the selected cells to numerical form in order to generate an authentication fingerprint reflecting the levels of trapped charges in the selected cells; and
   comparing the authentication fingerprint against the stored reference fingerprint.

15. A secure semiconductor memory cell apparatus comprising:
   an array of semiconductor memory cells;
   microcontroller for writing data to and reading data from the array;
   a data bus for transferring data between the microcontroller and the array;
   an address bus for identifying memory cells for reading and writing by the microcontroller;
   a control bus for allowing transfer of instructions between the memory array and the microcontroller; and
   a processor within the microcontroller operative direct the writing of data to selected cells of the memory array, the processor also being operative to direct reading of the selected cells using a varying threshold to identify levels of trapped charges within the selected cells, the processor also being operative to generate a reference fingerprint comprising a numerical representation of the levels of trapped charges within the array.

* * * * *